United States Patent
Choi et al.

(10) Patent No.: US 9,184,378 B2
(45) Date of Patent: Nov. 10, 2015

(54) SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE

(71) Applicant: SK Hynix Inc., Icheon-si (KR)

(72) Inventors: Hye-Jung Choi, Icheon-si (KR); Su-Ock Chung, Icheon-si (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 13/946,483

(22) Filed: Jul. 19, 2013

(65) Prior Publication Data
US 2014/0291601 A1 Oct. 2, 2014

(30) Foreign Application Priority Data

Mar. 27, 2013 (KR) ........................ 10-2013-0032830

(51) Int. Cl.
*H01L 45/00* (2006.01)
*H01L 43/12* (2006.01)
*H01L 27/22* (2006.01)
*H01L 27/24* (2006.01)

(52) U.S. Cl.
CPC .......... *H01L 45/1233* (2013.01); *H01L 27/222* (2013.01); *H01L 27/2463* (2013.01); *H01L 27/2481* (2013.01); *H01L 43/12* (2013.01); *H01L 45/04* (2013.01); *H01L 45/06* (2013.01); *H01L 45/08* (2013.01); *H01L 45/141* (2013.01); *H01L 45/146* (2013.01); *H01L 45/1675* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 7,961,496 B2 * | 6/2011 | Baek et al. | 365/148 |
| 8,043,926 B2 | 10/2011 | Cho et al. | |
| 8,575,585 B2 * | 11/2013 | Yang et al. | 257/2 |
| 2007/0246782 A1 * | 10/2007 | Philipp et al. | 257/379 |
| 2008/0090337 A1 * | 4/2008 | Williams | 438/133 |
| 2010/0155687 A1 | 6/2010 | Reyes et al. | |
| 2011/0001112 A1 * | 1/2011 | Kiyotoshi | 257/3 |
| 2012/0176831 A1 * | 7/2012 | Xiao et al. | 365/148 |

FOREIGN PATENT DOCUMENTS

| | | | | |
|---|---|---|---|---|
| KR | 10-2010-0106213 A | | 10/2010 | |
| WO | WO 2011008195 A2 * | | 1/2011 | ............. H01L 27/02 |

OTHER PUBLICATIONS

Christophe J Chevallier et al., "A 0.13μm 64Mb Multi-Layered Conductive Metal-Oxide Memory", IEEE International Solid-State Circuits Conference, Feb. 9, 2010, pp. 260-261, IEEE.

I.G. Baek et al., "Realization of Vertical Resistive Memory (VRRAM) using cost effective 3D Process", IEDM11-738, 2011, pp. 31.8.1-31.8.4, IEEE.

Z. Wei et al., "Demonstration of High-density ReRAM Ensuring 10-year Retention at 85°C Based on a Newly Developed Reliability Model", IEDM11-721, 2011, pp. 31.4.1 — 31.1.4, IEEE.

K. Aratani et al., "A Novel Resistance Memory with High Scalability and Nanosecond Switching", 2007, pp. 783-786, IEEE.

* cited by examiner

*Primary Examiner* — Andres Munoz

(57) ABSTRACT

A semiconductor device includes first lines extending in a first direction; second lines extending in a second direction crossing with the first direction; and first resistance variable elements defined between the first lines and the second lines and each including a first substance layer and a second substance layer, wherein the first substance layer extends in the first direction and the second substance layer extends in the second direction.

11 Claims, 12 Drawing Sheets

SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE

CROSS-REFERENCE TO RELATED APPLICATION

The present application claims priority of Korean Patent Application No. 10-2013-0032830, filed on Mar. 27, 2013, which is incorporated herein by reference in its entirety.

BACKGROUND

1. Field

Embodiments relate to a semiconductor device and a method for fabricating the same, and more particularly, to a semiconductor device which may include a resistance variable element configured to switch between different resistance states in response to an applied voltage or current, and a method for fabricating the same.

2. Description of the Related Art

Recently, as electronic appliances trend toward miniaturization, low power consumption, high performance, and multi-functionality, semiconductor devices capable of storing information in various electronic appliances such as a computer, a portable communication device, and the like are in high demand. Such semiconductor devices may include memories which can store data using a resistance variable element to be switched between different resistance states in response to an applied voltage or current, for example, an RRAM (resistive random access memory), a PRAM (phase change random access memory), an FRAM (ferroelectric random access memory), an MRAM (magneto-resistive random access memory), an E-fuse, and the like.

SUMMARY

Various embodiments are directed to a semiconductor device which can permit process simplification and processing cost reduction even when scaling is implemented and can reduce disturbance between resistance variable elements to improve the reliability of a semiconductor device, and a method for fabricating the same.

In an embodiment, a semiconductor device may include: first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction.

In an embodiment, a method for fabricating a semiconductor device may include: forming first structures over a substrate which extend in a first direction, the first structures comprising first lines and first substance layers in a stacked configuration; and forming second structures which extend in a second direction crossing with the first direction, the second structures comprising second lines and second substance layers in a stacked configuration; wherein a plurality of resistance variable elements are defined between the first lines and the second lines at crossing regions between the first substance layers and the second substance layers.

In an embodiment, a microprocessor may include: a control unit configured to receive a signal including an external command, and to perform extraction, decoding, and controlling of input and output of the external command; an operation unit configured to perform an operation in response to a signal of the control unit; and a memory unit configured to store any of (i) data for performing the operation, (ii) data corresponding to a result of performing the operation, and (iii) an address of data for which the operation is performed, wherein the memory unit comprises: first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction.

In an embodiment, a processor may include: a core unit configured to perform, in response to an external command, an operation corresponding to the external command, by using data; a cache memory unit configured to store any of (i) data for performing the operation, (ii) data corresponding to a result of performing the operation, and (iii) an address of data for which the operation is performed; and a bus interface connected between the core unit and the cache memory unit, and configured to transmit data between the core unit and the cache memory unit, wherein the cache memory unit comprises: first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction.

In an embodiment, a system may include: a processor configured to decode a command inputted from outside and control an operation for information according to a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between (i) at least one of the processor, the auxiliary memory device and the main memory device and (ii) the outside, wherein at least one of the auxiliary memory device and the main memory device comprises: first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction.

In an embodiment, a data storage system may include: a storage device configured to store data and preserve stored data regardless of power supply; a controller configured to control input and output of data to and from the storage device in response to an external command received from outside; a temporary storage device configured to temporarily store data exchanged between the storage device and the outside; and an interface configured to perform communication between (i) at least one of the storage device, the controller, and the temporary storage device and (ii) the outside, wherein at least one of the storage device and the temporary storage device comprises: first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction.

In an embodiment, a memory system may include: a memory configured to store data and preserve stored data regardless of power supply; a memory controller configured to control input and output of data to and from the memory in response to an external command received from outside; a buffer memory configured to buffer data exchanged between the memory and the outside; and an interface configured to perform communication between (i) at least one of the memory, the memory controller, and the buffer memory and (ii) the outside, wherein at least one of the memory and the buffer memory comprises: first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction.

DETAILED DESCRIPTION

Figure 1A:
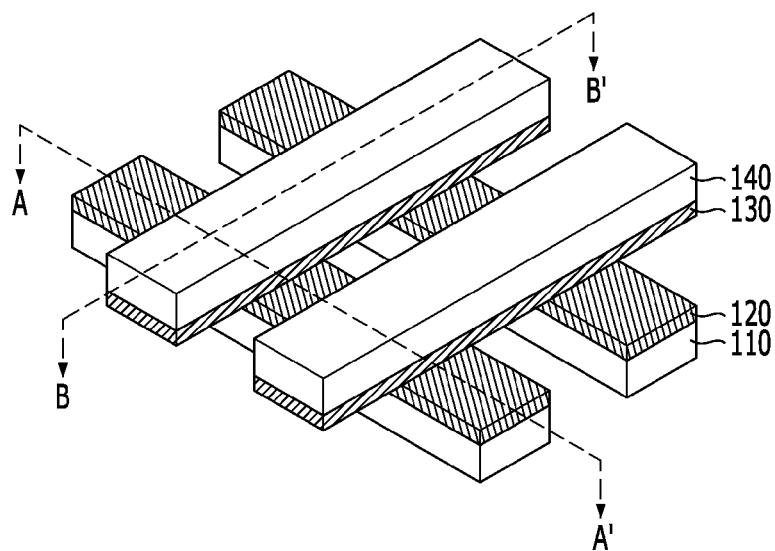
FIGS. 1A and 1B are a perspective view and a plan view, respectively, illustrating a semiconductor device in accordance with an embodiment.

Various embodiments will be described below in more detail with reference to the accompanying drawings. The present disclosure may, however, include embodiments in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 1B:
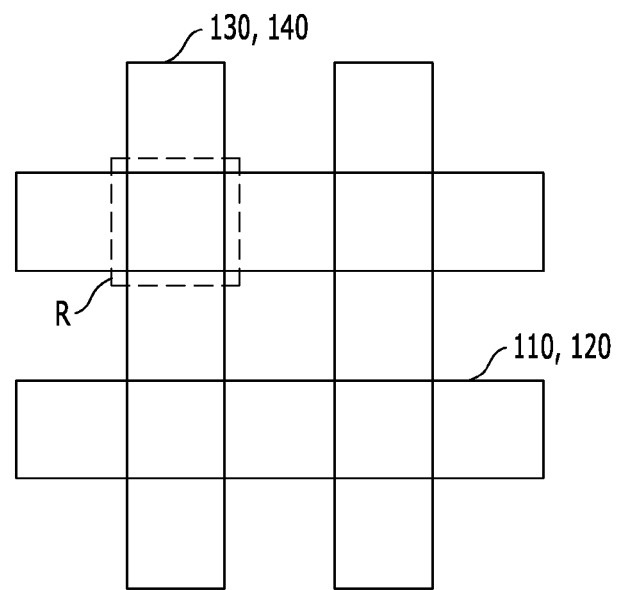

FIGS. 1A and 1B are a perspective view and a plan view, respectively, illustrating a semiconductor device in accordance with an embodiment.

Referring to FIGS. 1A and 1B, the semiconductor device in accordance with the embodiment includes first lines 110 which extend in a first direction (see the line A-A'), second lines 140 which extend in a second direction (see the line B-B') crossing with the first direction. As shown in FIG. 1B, resistance variable elements R are disposed between the first lines 110 and the second lines 140 and are disposed at respective crossing (intersecting) regions of the first lines 110 and the second lines 140.

Each of the resistance variable elements R is an element that is configured to switch between different resistant states in response to an applied voltage or current. The voltage or current may be applied to one or both ends thereof through the first line 110 and the second line 140. Depending on the voltage or current applied at a point in time, the resistance may vary between at least two states, a low resistance state and a high resistance state. Data may be stored using a change in the resistance states. For example, data '0' may be stored in the case where the resistance variable element R is in a low resistance state. In addition, data '1' may be stored in the case where the resistance variable element R is in a high resistance state.

The resistance variable element R may include a single layer or a plurality of layers. The layer(s) may include any suitable material known in the art capable of undergoing a resistance change. For example, the material may include a known material used in an RRAM, a PRAM, a MRAM, and/or a FRAM memory device. For example, the material may comprise a metal oxide such as a perovskite-based substance, a transition metal oxide, a phase change substance such as a chalcogenide-based substance, a ferroelectric substance, a ferromagnetic substance, and the like.

In one embodiment, the resistance variable element R may exhibit a resistance variable property as a multi-layer structure comprising at least two stacked substance layers, which would not exhibit a resistance variable properties were each layer provided alone. In this multi-layer embodiment, at least one substance layer extends in a first direction along the first line 110, and the remaining one or more substance layers extend in a second direction along the second line 140.

For example, in the case where the resistance variable element R includes a first substance layer 120 and a second substance layer 130 as shown in FIG. 1A, the first substance layer 120 may extend in the first direction, and the second substance layer 130 may extend in the second direction. Since the variable resistance properties are exhibited when the first and second substance layers 120 and 130 are present together, the resistance variable element R is formed at an each intersection of the first substance layer 120 and the second substance layer 130.

It is appreciated that the semiconductor device is not limited to one having two substance layers. In other embodiments, the resistance variable element R may include at least three layers wherein at least one layer of the at least three layers may extend in the first direction and the remaining layers extend in the second direction. In the same manner, even in the case of at least three layers, each resistance variable element R may be formed at a crossing region of at least two layers that extend in different direction. In still other embodiments, the semiconductor device may comprise a plurality of resistance variable elements stacked vertically on top of one another as is further described below.

In embodiments where the resistance variable element R according to the present embodiment is used in a semiconductor memory, for example, one of the first and second substance layers 120 and 130 may be an oxygen-deficient metal oxide layer, which is relatively deficient in oxygen and includes a large amount of oxygen vacancies, and the other of the first and second substance layers 120 and 130 may be an oxygen-rich metal oxide layer, which is relatively rich in oxygen.

While not wishing to be bound by theory, the oxygen-deficient metal oxide layer may play a role in supplying oxygen vacancies to the oxygen-rich metal oxide layer. When oxygen vacancies are introduced into the oxygen-rich metal oxide layer, a current path (or filament) formed by oxygen vacancies may be created in the oxygen-rich metal oxide layer. In this way, a current path may be created based upon whether or not oxygen vacancies are introduced into the oxygen-rich metal oxide layer from the oxygen-deficient metal oxide layer.

The oxygen-deficient metal oxide layer or the oxygen-rich metal oxide layer may comprise, for example, one or more of a Ti oxide, a Ta oxide, an Fe oxide, an Hf oxide, an Nb oxide, a Zr oxide, and the like. The oxygen-deficient metal oxide layer and the oxygen-rich metal oxide layer may be formed from the same or different materials. In certain embodiments, the oxygen-rich metal oxide layer may be a substance satisfying a stoichiometric ratio, for example, such as $TiO_2$ and $Ta_2O_5$. The oxygen-deficient metal oxide layer may be a substance which is deficient in oxygen when compared to the oxygen-rich metal oxide layer, for example, such as $TiO_x$ ($x<2$) and $T_aO_y$ ($y<2.5$).

In an embodiment, the resistance variable element R may exhibit low resistance in the state when a filament is formed and may have a comparatively higher resistance when a filament is not formed. However, it is appreciated that embodiments of the present disclosure are not limited to this, and it is to be noted that the resistance variable element R may be formed as a multi-layer including various substances according to a device to which the resistance variable element R is applied, for example, such as a PRAM, an FRAM, an MRAM and so forth.

While it was illustrated in the present embodiment that the first substance layer 120 and the first line 110 have the same planar shape and the second substance layer 130 and the second line 140 have the same planar shape, the present invention is not so limited. It is sufficient that one of the first and second substance layers 120 and 130 extends in the same direction as the first lines 110 and the other of the first and second substance layers 120 and 130 extends in the same direction as the second lines 140, between the first and second lines 110 and 140. For example, the first substance layer 120 may have a different planar shape from the first lines 110 while extending in the same direction as the first lines 110, and the second substance layer 130 may have a different planar shape from the second lines 140 while extending in the same direction as the second lines 140. Alternatively, for example, at least one of the first substance layer 120 and the second substance layer 130 may be disposed not only between the first lines 110 and the second lines 140, but may also additionally be disposed at different regions. This is shown in FIG. 3D and will be described later in detail at a corresponding part.

The first lines 110 and the second lines 140 may comprise a single layer or a plurality of layers. The one or more layers may include a conductive material, for example, a metal such as platinum (Pt), tungsten (W), aluminum (Al), copper (Cu) and tantalum (Ta) or a metal nitride such as a titanium nitride (TiN) and a tantalum nitride (TaN).

The various semiconductor devices described herein provide a number of advantages. For one, the patterning of layers is greatly simplified because the first substance layer 120 and the second substance layer 130 have line shapes. Also, since the first substance layer 120 extends in the same direction as the first lines 110, the first substance layer 120 may be formed together with the first lines 110, and, since the second substance layer 130 extends in the same direction as the second lines 140, the second substance layer 130 may also be formed together with the second lines 140. In this case, advantages are provided in that the number of processing steps may be decreased and/or costs may be reduced.

Furthermore, because the first substance layer 120 and the second substance layer 130 extend in the different directions, the resistance variable elements R may be formed at crossing regions or intersections of the first substance layer 120 and the second substance layer 130. Accordingly, disturbance between adjacent resistance variable elements R may be reduced in spite of scaling of a semiconductor device.

The semiconductor devices described herein may be formed through various fabrication methods, and some of these methods are described below with reference to FIGS. 2A to 3E.

Figure 2A:
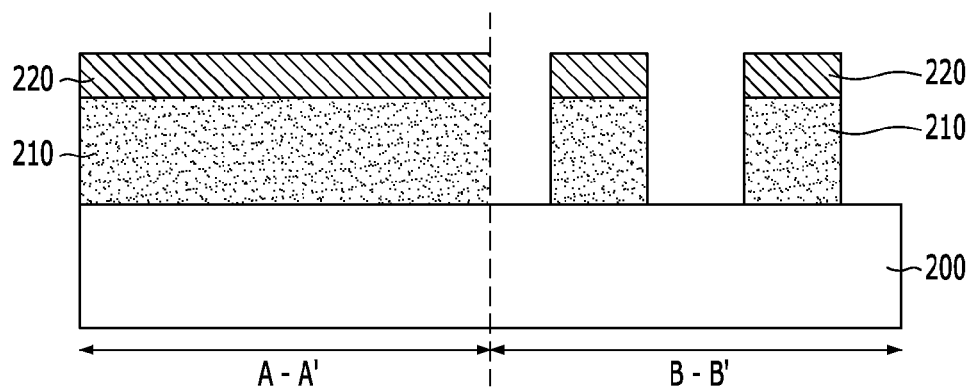
FIGS. 2A to 2C are cross-sectional views illustrating a method for fabricating the semiconductor device in accordance with an embodiment.
Figure 2B:
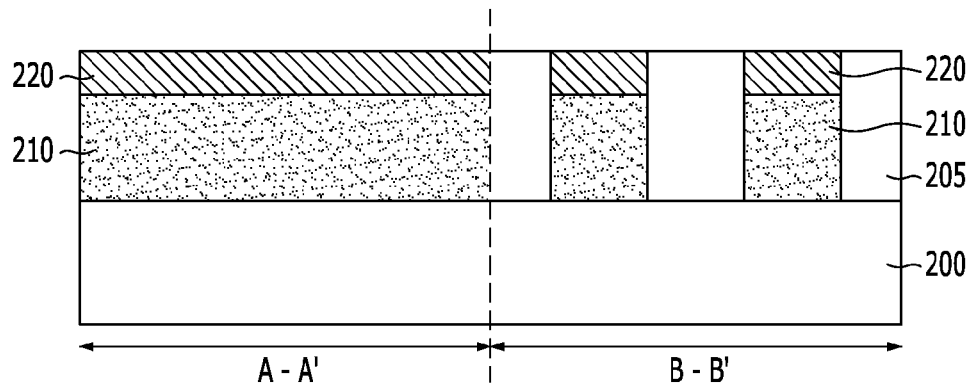
Figure 2C:
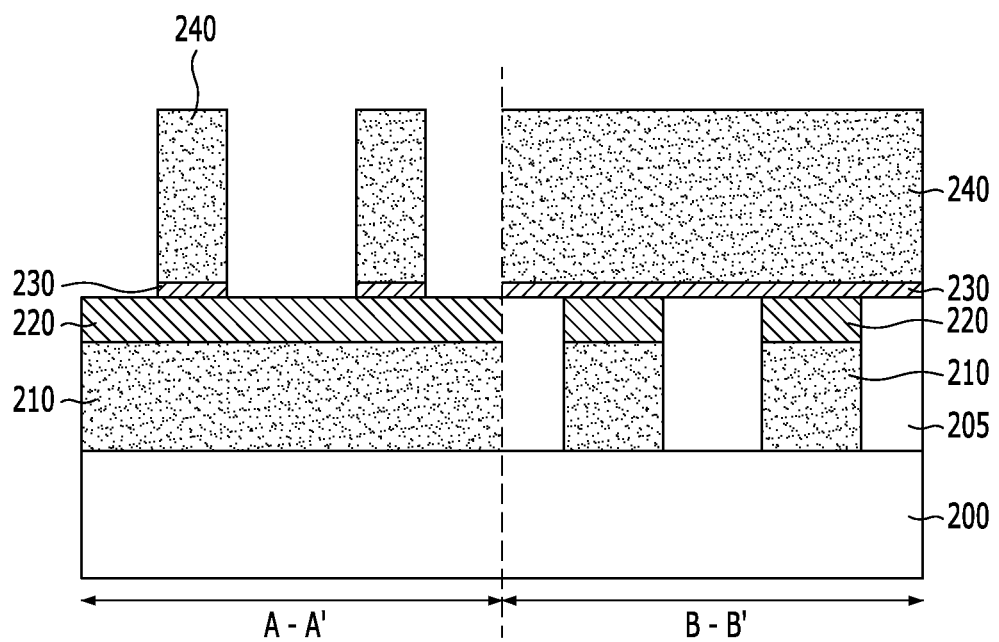

First, FIGS. 2A to 2C are cross-sectional views illustrating a method for fabricating the semiconductor device in accordance with one embodiment. FIGS. 2A to 2C are illustrated on the basis of cross-sections along the lines A-A' and B-B' of FIG. 1A.

Referring to FIG. 2A, a substrate 200 is provided with a predetermined desired underlying structure (not shown). The substrate 200 may be formed from any suitable substrate for a semiconductor device, such as a semiconductor substrate or an insulator substrate as are well known in the art.

Line patterns (structures) comprising first lines 210 and first substance layers 220 stacked on one another and which extend in a first direction are formed on the substrate 200. These line patterns may be formed by forming a conductive layer for the first lines 210, forming a first layer for the first substance layers 220 on the conductive layer, and etching these layers together using one mask. In the present embodiment, the first substance layers 220 may be a component of a multi-layer resistance variable element, R, and may comprise, for example, an oxygen-deficient metal oxide layer.

Referring to FIG. 2B, in this embodiment, a first interlayer dielectric layer 205 fills in the spaces between the line patterns comprising the first lines 210 and first substance layers 220. The first interlayer dielectric layer 205 may be formed by applying a dielectric substance to the resulting product of FIG. 2A and performing a planarization process, for example, a CMP (chemical mechanical polishing) process until the first substance layers 220 are exposed. In one embodiment, the first interlayer dielectric layer 205 may include any suitable oxide layer, such as silicon dioxide.

Referring to FIG. 2C, second line patterns (structures) in which second substance layers 230 and second lines 240 are stacked on one another and which extend in the second direction are formed on the resulting product of FIG. 2B. These line patterns comprising the second substance layers 230 and second lines 240 may be formed by forming a second layer for the second substance layers 230, forming a conductive layer for the second lines 240, and etching these layers together using one mask. In the present embodiment, the second substance layer 230 is a layer which may constitute the resistance variable element in cooperation with the first substance layer 220, and may be, for example, an oxygen-rich metal oxide layer. While not shown, it is appreciated that the spaces between the second line patterns may be filled with a dielectric substance.

By the processes described above, a semiconductor device similar to that shown in FIGS. 1A and 1B may be fabricated. The first lines 210, the first substance layer 220, the second substance layer 230 and the second lines 240 of FIG. 2C may respectively correspond to the first lines 110, the first substance layer 120, the second substance layer 130 and the second lines 140 of FIGS. 1A and 1B.

While it was described in the present embodiment that the first substance layer 220 is an oxygen-deficient metal oxide layer and the second substance layer 230 is an oxygen-rich metal oxide layer, this may be reversed such that the first substance layer 220 is an oxygen-rich metal oxide layer and the second substance layer 230 is an oxygen-deficient metal oxide layer. In certain embodiments, the thickness of the oxygen-deficient metal oxide layer may be larger than the thickness of the oxygen-rich metal oxide layer. However, it is appreciated that the present embodiment is not so limited, and it is sufficient that the first substance layer 220 and the second substance layer 230 cooperatively exhibit a resistance variable property.

FIGS. 3A to 3E are cross-sectional views illustrating a method for fabricating a semiconductor device in accordance with yet another embodiment. FIGS. 3A to 3E are illustrated on the basis of cross-sections along the lines A-A' and B-B' of FIG. 1A.

Figure 3A:
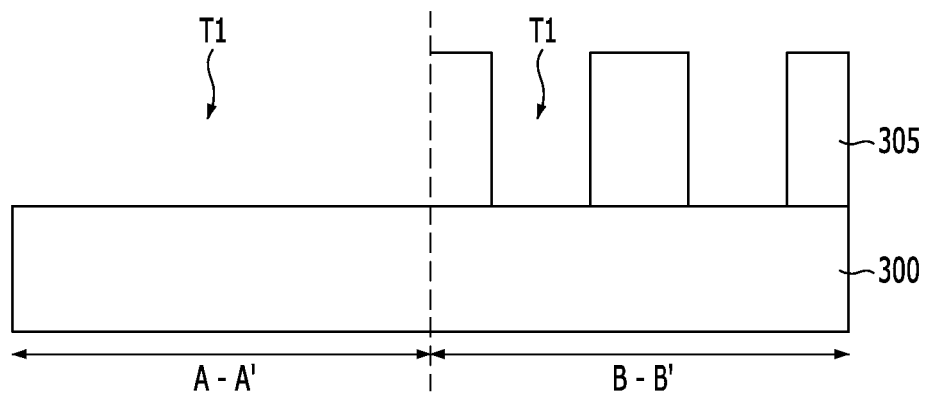
FIGS. 3A to 3E are cross-sectional views illustrating a method for fabricating a semiconductor device in accordance with another embodiment.

Referring to FIG. 3A, a substrate 300 which is provided with a predetermined desired underlying structure (not shown). The substrate 300 be formed from any suitable substrate for a semiconductor device, such as a semiconductor substrate and an insulator substrate as are well known in the art.

After forming a first interlayer dielectric layer 305 on the substrate 300, by selectively etching the first interlayer dielectric layer 305, first trenches T1 which have line shapes extending in a first direction are defined. The first interlayer dielectric layer 305 may be formed using, for example, an oxide, such as silicon dioxide.

Figure 3B:
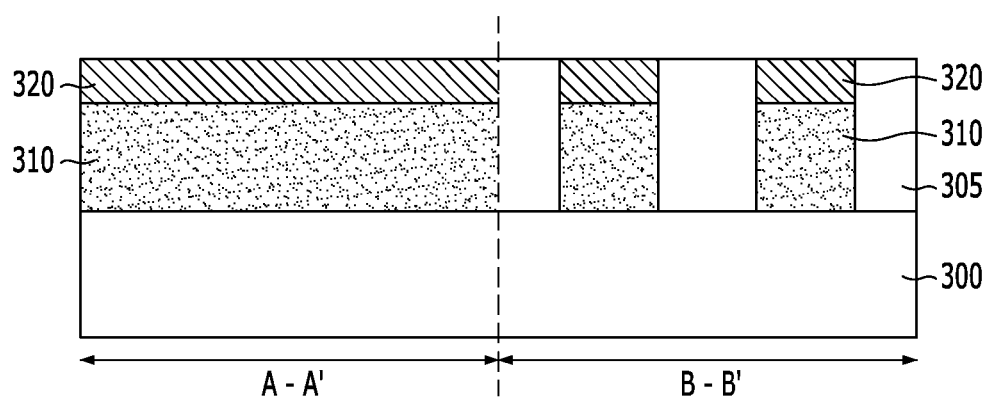

Referring to FIG. 3B, stack structures comprising the first lines 310 and the first substance layers 320 are formed in the first trenches T1.

In detail, the first lines 310 may be formed within the first trenches T1, by forming a conductive layer for the first lines 310 and partially removing the conductive layer through etch-back or the like until a desired height is obtained. In this way, the first lines 310 that fill the lower portions of the first trenches T1 may be formed. Then, after depositing a layer for the first substance layers 320 on the first lines 310 and the first interlayer dielectric layer 305, a planarization process is performed on the deposited layer, for example, a Chemical Mechanical Planarization (CMP) process, until the surface of the first interlayer dielectric layer 305 is exposed.

Figure 3C:
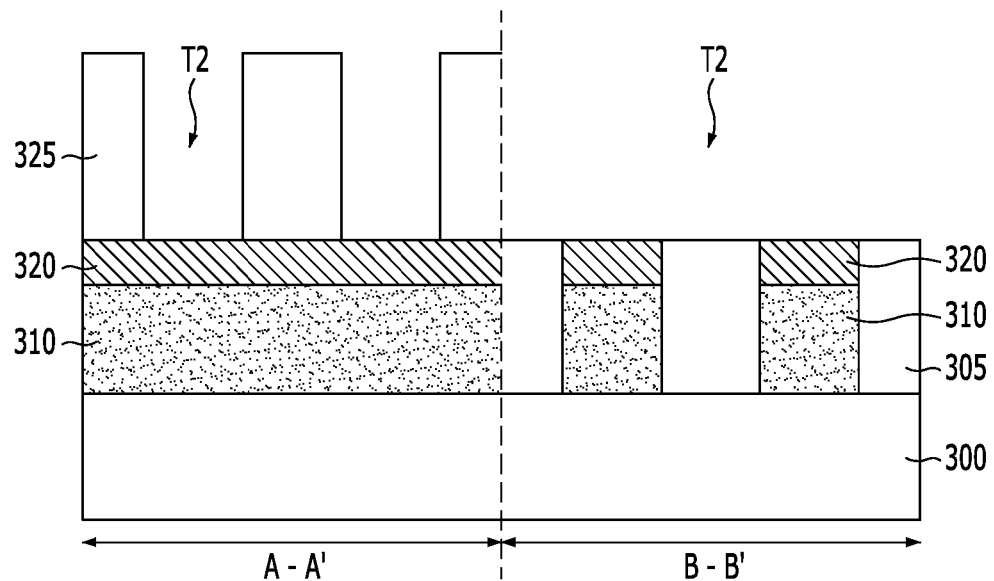
Figure 3D:
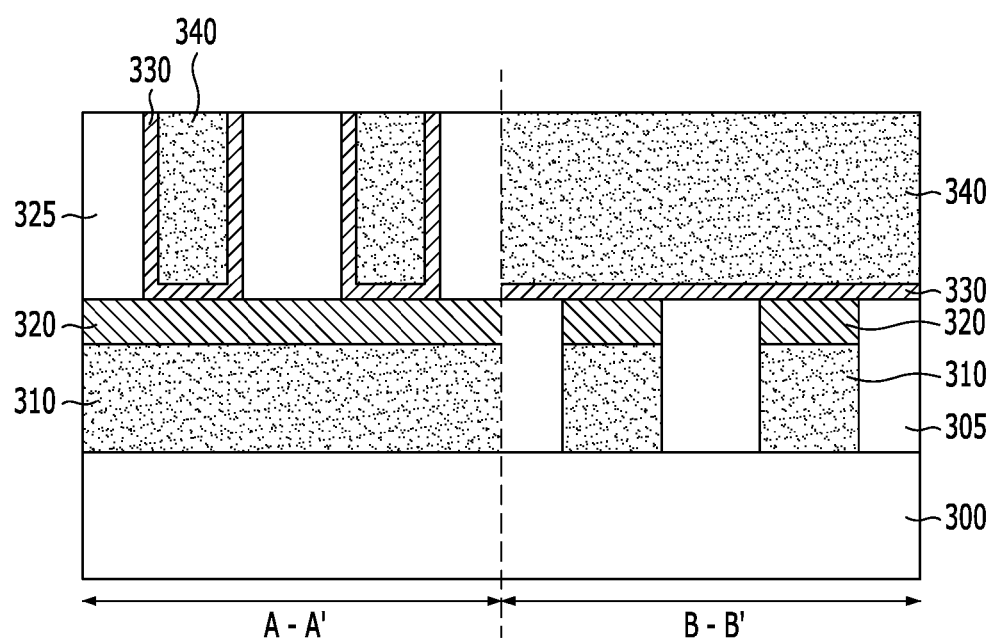

Referring to FIG. 3C, after forming a second interlayer dielectric layer 325 on the processing resultant of FIG. 3B, by selectively etching the second interlayer dielectric layer 325, second trenches T2 which expose the first substance layer 320 and have line shapes extending in a second direction are defined. While not shown, the second interlayer dielectric layer 325 may be formed with two layers having different etching rates relative to one another. For example, a two layered dielectric layer including a nitride layer and an oxide layer may be provided. In this embodiment, a first layer of the double layer, for example, a nitride layer may be used as an etch stop layer at which etching is primarily stopped when performing etching to define the second trenches T2. In this way, it is possible to precisely control the depth of the second trenches T2.

Referring to FIG. 3D, second substance layer 330s and second lines 340 are formed in the second trenches T2. The second substance layer 330 may be formed on the bottoms and one or more of the sidewalls of the second trenches T2, and the second lines 340 may fill the remaining spaces of the second trenches T2 in which the second substance layers 330 are formed. Therefore, in an embodiment, the second substance layer 330 may cover surfaces of the second lines 340 which face the first lines 310, that is, the bottoms of the second lines 340, and also both side surfaces of the second lines 340.

A method of forming the second substance layer 330 and the second lines 340 will be described below in detail. First, after forming a second layer for the second substance layers 330 as desired along the profile of the resulting product of FIG. 3C, a conductive layer for the second lines 340 is formed on the second layer 330 to a thickness that sufficiently fills the second trenches T2. Then, by performing a planarization process until the second interlayer dielectric layer 325 is exposed, the second substance layers 330 and the second lines 340 may be formed as shown in FIG. 3D.

Since it is sufficient that the first substance layer 320 and the second substance layer 330 cross with each other at several intersecting points between the first lines 310 and the second lines 340, the shape of the first substance layer 320 or the second substance layer 330 need not have a specific profile or shape. In other words, as shown in FIG. 3D, the second substance layer 330 may be disposed on not only a first surface of the second lines, but also both side surfaces of the second lines 340.

Figure 3E:
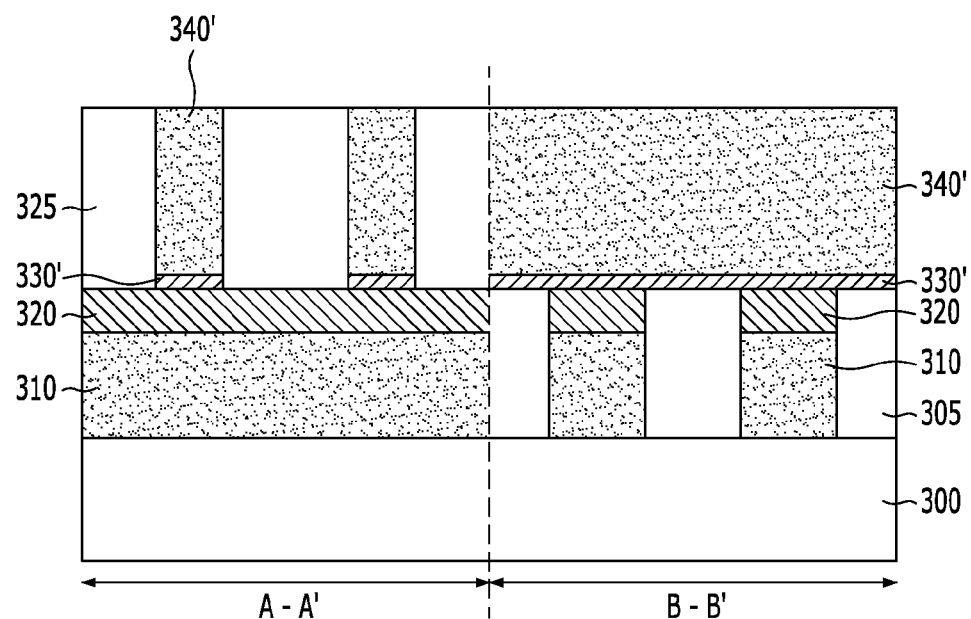

In other embodiments, after performing the process of FIG. 3C, the process of FIG. 3E may be performed instead of the process of FIG. 3D.

Referring to FIG. 3E, stack structures comprising the second substance layers 330' and the second lines 340' may be formed in the second trenches T2.

In this embodiment, the second substance layers 330' may be formed within the second trenches T2 by forming a second layer for the second substance layers 330' and partially removing the second layer through etch-back or the like until a desired height is obtained. Thereafter, the second lines 340' may be formed on the second substance layers 330'. This may be done by depositing a conductive layer on the resulting product formed with the second substance layers 330' and performing a planarization process on the resulting product until the second interlayer dielectric layer 325 is exposed.

In the embodiments of FIGS. 3A to 3E described above, since lines and substance layers are formed in such a way as to be filled in dielectric layers, advantageously, etching in order to form the lines and the substance layers is not required. In other words, an etching process need not be performed when forming resistance variable elements in this embodiment. Accordingly, it is possible to prevent the occurrence of damage due to etching when fabricating resistance variable elements. In particular, leakage current occurring along a surface having undergone etching damage may be avoided.

Although, in the above-described embodiments, the embodiment of FIGS. 2A to 2C illustrates the case where both lines and substance layers are formed through etching and the embodiment of FIGS. 3A to 3E illustrates the case where both lines and substance layers are formed through filling, etching and filling may be used in a mixed manner. For instance, the first lines 210 and 310 and the first substance layers 220 and 320 may be formed through etching and the second lines 240 and 340 and the second substance layers 230 and 330 may be formed through filling. Conversely, the first lines 210 and 310 and the first substance layers 220 and 320 may be formed through filling and the second lines 240 and 340 and the second substance layers 230 and 330 may be formed through etching.

In the above-described embodiments, in the case where resistance variable elements comprising first and second substance layers directly contact interlayer dielectric layers, the resistance variable elements and the interlayer dielectric layers may react with each other. For instance, in the case where the resistance variable elements include a metal oxide and the interlayer dielectric layers include an oxide, an undesired reaction between the resistance variable elements and the oxides may occur. In order to address this problem, in one embodiment, one or more spacers may be disposed between the resistance variable elements and the interlayer dielectric layers to prevent them from reacting with each other. Hereinbelow, this will be exemplarily described with reference to FIGS. 4 and 5.

Figure 4:
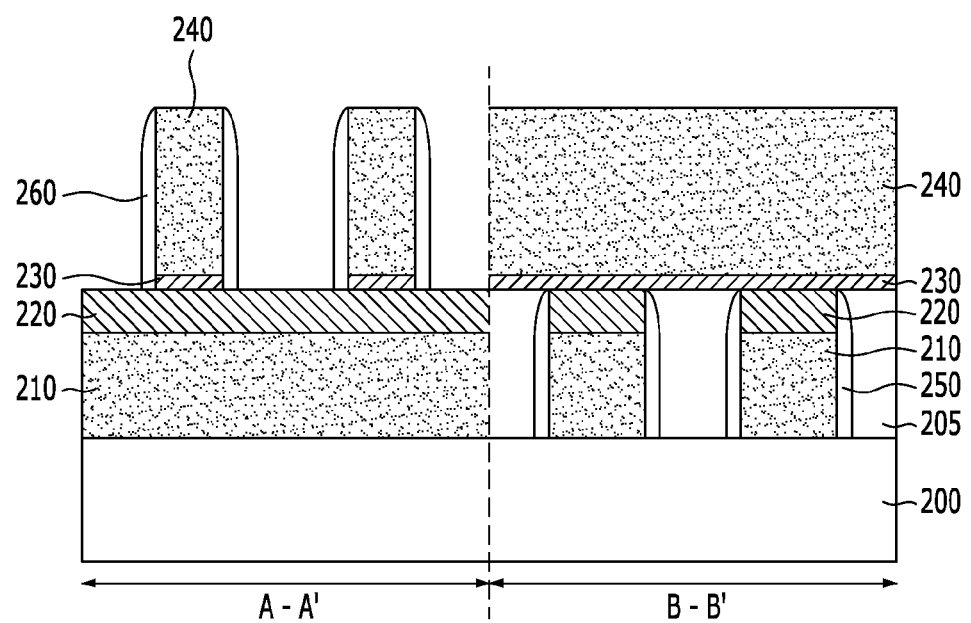
FIG. 4 is a cross-sectional view illustrating a semiconductor device in accordance with another embodiment and a method for fabricating the same.

FIG. 4 is a cross-sectional view illustrating a semiconductor device in accordance with another embodiment and illustrating a method for fabricating the same. In particular, FIG. 4 illustrates a semiconductor device which is fabricated by adding spacers to the embodiment shown in FIGS. 2A to 2C and explains a method for fabricating the same.

Referring to FIG. 4, after forming first line patterns (structures) in which first lines 210 and corresponding portions of the first substance layers 220 on the first lines 210 are stacked and which extend in a first direction, first spacers 250 may be formed on the sidewalls of the line patterns. In this way, the first spacers 250 also extend in the first direction. The first spacers 250 may be formed along the entire surface of the resulting product formed with the first line patterns, and then performing blanket etching. The first spacers 250 may comprise any substance which is inert to or otherwise capable of preventing a reaction between the first substance layer 220 and a first interlayer dielectric layer 205. For example, in the case where the first substance layer 220 is a metal oxide and the first interlayer dielectric layer 205 is an oxide compound, the first spacers 250 may comprise a nitride compound. Then, the first interlayer dielectric layer 205 is filled in the spaces between the first spacers 250.

After forming line patterns in which corresponding portions of the second substance layers 230 and second lines 240 are stacked and which extend in a second direction, second spacers 260 are formed on the sidewalls of the second line patterns. In this way, the second spacers 260 may also extend in the second direction in such a way as to cross with the first spacers 250. Optionally, the process and materials used to form the second spacers 260 may be substantially the same as those used to form the first spacers 250.

Figure 5:
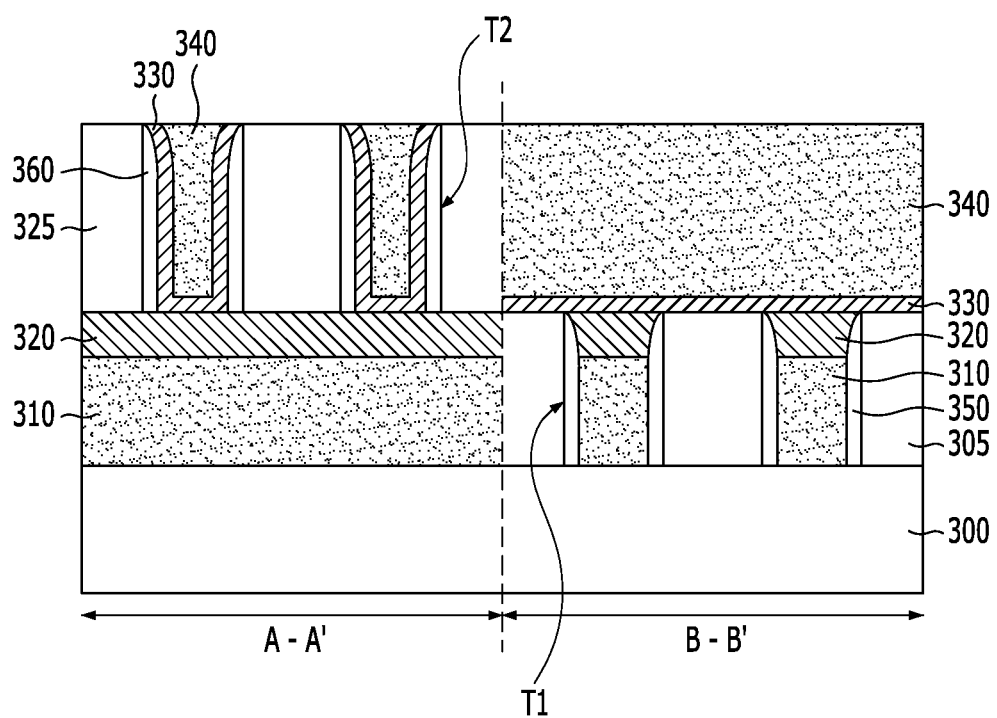
FIG. 5 is a cross-sectional view illustrating a semiconductor device in accordance with another embodiment and a method for fabricating the same.

Referring to FIG. 5, FIG. 5 is a cross-sectional view illustrating a semiconductor device in accordance with another embodiment and illustrating a method for fabricating the same. In particular, FIG. 5 illustrates a semiconductor device which is fabricated by adding spacers to the embodiment shown in FIGS. 3A to 3D and illustrating a method for fabricating the same.

As shown in FIG. 5, after defining first trenches T1 which extend in a first direction in a first interlayer dielectric layer 305, first spacers 350 are formed on the sidewalls of the first trenches T1. In this way, the first spacers 350 also extend in the first direction. In one embodiment, the first spacers 350 may be formed by forming the first spacers 350 along the entire surface of the resultant defined with the first trenches T1, and then performing blanket etching.

The stack structures of first lines 310 and first substance layers 320 may also be formed in the first trenches T1 in which the first spacers 350 are formed.

After forming a second interlayer dielectric layer 325 and defining second trenches T2 which extend in a second direction, second spacers 360 may be also be formed on one or more of the sidewalls of the second trenches T2. In this way, the second spacers 360 may extend in the second direction in such a way so as to cross with the first spacers 350. Optionally, the process and materials used to form the second spacers 360 may be substantially the same as those used to form the first spacers 350.

Once the second spacers 360 are formed, the second substance layers 330 and second lines 340 may be formed in the second trenches T2 in which the second spacers 360 were formed. As shown in FIG. 5, the second substance layer 330 may have a shape which covers a bottom side, and both side surfaces of the second lines 340.

However, it is appreciated that the present embodiment is not so limited. While not shown in a drawing, the stack structures of the second substance layer and second lines may be formed in the second trenches T2 in which the second spacers 360 are formed, similar to the manner described above with reference to FIG. 3E.

Meanwhile, when assuming that the configuration shown in FIG. 1A constitutes one stack, the stack may be repeatedly stacked in the vertical direction. This will be described below with reference to FIG. 6.

Figure 6:
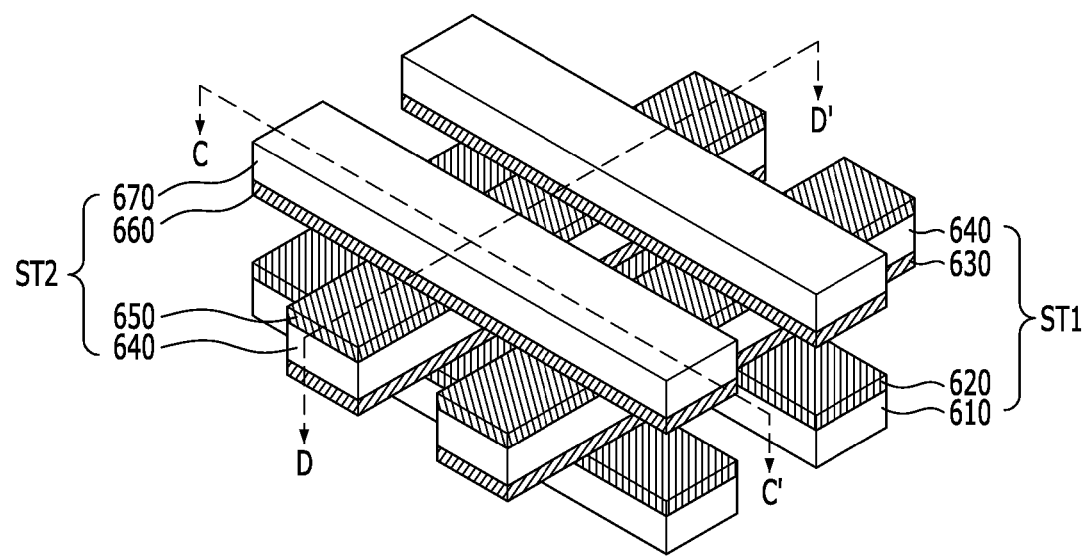
FIG. 6 is a perspective view illustrating a semiconductor device in accordance with another embodiment.

FIG. 6 is a perspective view illustrating a semiconductor device in accordance with another embodiment.

Referring to FIG. 6, the semiconductor device in accordance with another embodiment includes a first stack ST1 and a second stack ST2 which are stacked in the vertical direction. Each of the first stack ST1 and the second stack ST2 is substantially the same as the semiconductor device of FIG. 1A.

In detail, the first stack ST1 may include first lines 610 which extend in a first direction (see the line C-C'), second lines 640 which extend in a second direction (see the line D-D') crossing with the first direction, and first and second substance layers 620 and 630 which are defined between the first lines 610 and the second lines 640 and respectively extend in the first and second directions. The first and second substance layers 620 and 630 cooperatively exhibit a resistance variable characteristic, and accordingly, resistance variable elements may be formed at crossing regions of the first and second substance layers 620 and 630. Further, the second stack ST2 may include the second lines 640 which extend in the second direction, third lines 670 which extend in the first direction, and third and fourth substance layers 650 and 660 which are defined between the second lines 640 and the third lines 670 and respectively extend in the second and first directions. The third and fourth substance layers 650 and 660 cooperatively exhibit a resistance variable characteristic, and accordingly, resistance variable elements may be formed at crossing regions of the third and fourth substance layers 650 and 660.

The first stack ST1 and the second stack ST2 may share the second lines 640. In other words, the second lines 640 may serve as the top lines of the first stack ST1 and the bottom lines of the second stack ST2 in the orientation shown. However, the present invention is not limited to this, and the first stack ST1 and the second stack ST2 may not share any lines.

Moreover, for instance, the first substance layer 620 and the third substance layer 650 may be formed from the same material, and the second substance layer 630 and the fourth substance layer 660 may be formed from the same material. For example, the first and third substance layers 620 and 650 may be oxygen-deficient metal oxide layers, and the second and fourth substance layers 630 and 660 may be oxygen-rich metal oxide layers. On the contrary, in another embodiment, the first substance layer 620 and the fourth substance layer 660 may be formed from the same material, and the second substance layer 630 and the third substance layer 650 may be formed from the same material. For example, the first and fourth substance layers 620 and 660 may be oxygen-deficient metal oxide layers, and the second and third substance layers 630 and 650 may be oxygen-rich metal oxide layers.

The lines 610, 640 and 670 and the substance layers 620, 630, 650 and 660 which are included in such first and second stacks ST1 and ST2 may be formed by combining the above-described etching and filling in a variety of ways.

While it was explained in the embodiment shown in FIG. 6 that two stacks ST1 and ST2 are stacked, it is to be noted that at least three stacks may be stacked in the vertical direction.

In the semiconductor device and the method for fabricating the same in accordance with the above-described embodiments, it is possible to simplify manufacturing and reduce process costs even when scaling is implemented, and furthermore disturbances between resistance variable elements may be reduced, thereby improving the reliability of a semiconductor device.

Figure 7:
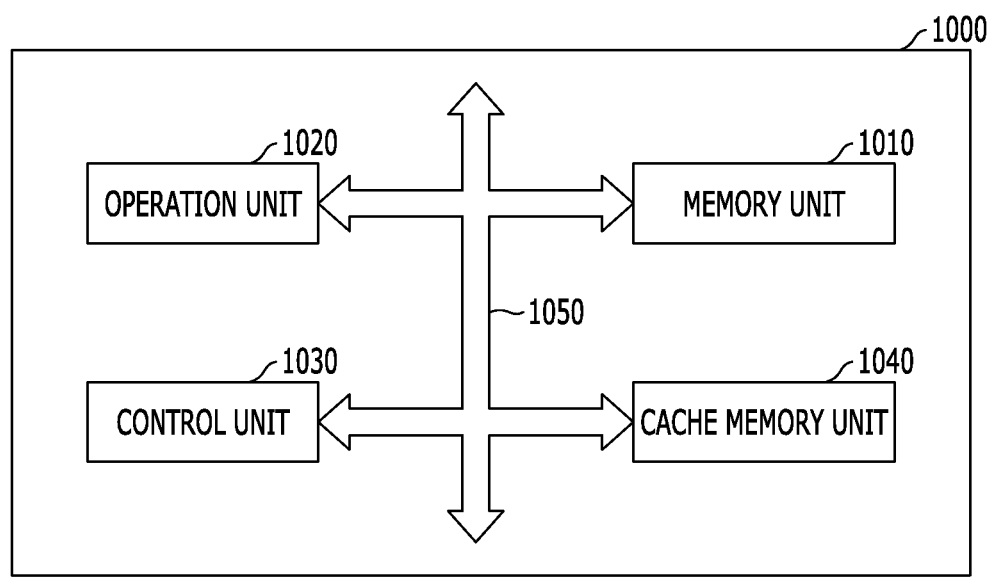
FIG. 7 is a configuration diagram of a microprocessor in accordance with another embodiment.

FIG. 7 is a configuration diagram of a microprocessor in accordance with an embodiment.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020 and a control unit 1030. The microprocessor 1000 may be various types of processing units such as a central processing unit (CPU), a graphic processing unit (GPU), a digital signal processor (DSP) and an application processor (AP).

The memory unit 1010 is a part which stores data in the microprocessor 1000, as a processor register or a register. The memory unit 1010 may include a data register, an address register and a floating point register. In addition, the memory unit 1010 may include various registers. The memory unit 1010 may perform the function of temporarily storing data for which operations are to be performed by the operation unit 1020, result data from performing the operations, and an address where data for performing of the operations are stored.

The memory unit 1010 may include one of the above-described semiconductor devices. The memory unit 1010 including a semiconductor device as described herein may include first lines extending in a first direction; second lines extending in a second direction crossing with the first direction; and first resistance variable elements defined between the first lines and the second lines and each including a first substance layer and a second substance layer, wherein the first substance layer extends in the first direction and the second substance layer extends in the second direction. Through this, a fabrication process of the memory unit 1010 may become easy, scaling of the memory unit 1010 may be possible and reliability of the memory unit 1010 may be improved. As a consequence, a fabrication process of the microprocessor 1000 is simplified, scaling of the microprocessor 1000 may be possible, and the reliability of the microprocessor 1000 may be improved.

The operation unit 1020 is a part which performs operations in the microprocessor 1000. The operation unit 1020 performs arithmetical operations or logical operations according to signals transmitted from the control unit 1030. The operation unit 1020 may include at least one arithmetic logic unit (ALU).

The control unit 1030 receives signals from the memory unit 1010, the operation unit 1020 and an external device of the microprocessor 1000, performs extraction, decoding and controlling upon input and output of commands, and executes processing represented by programs.

The microprocessor 1000 according to the present embodiment may additionally include a cache memory unit 1040 which can temporarily store data to be inputted from an external device or to be outputted to an external device. In this case, the cache memory unit 1040 may exchange data with the memory unit 1010, the operation unit 1020 and the control unit 1030 through a bus interface 1050.

Figure 8:
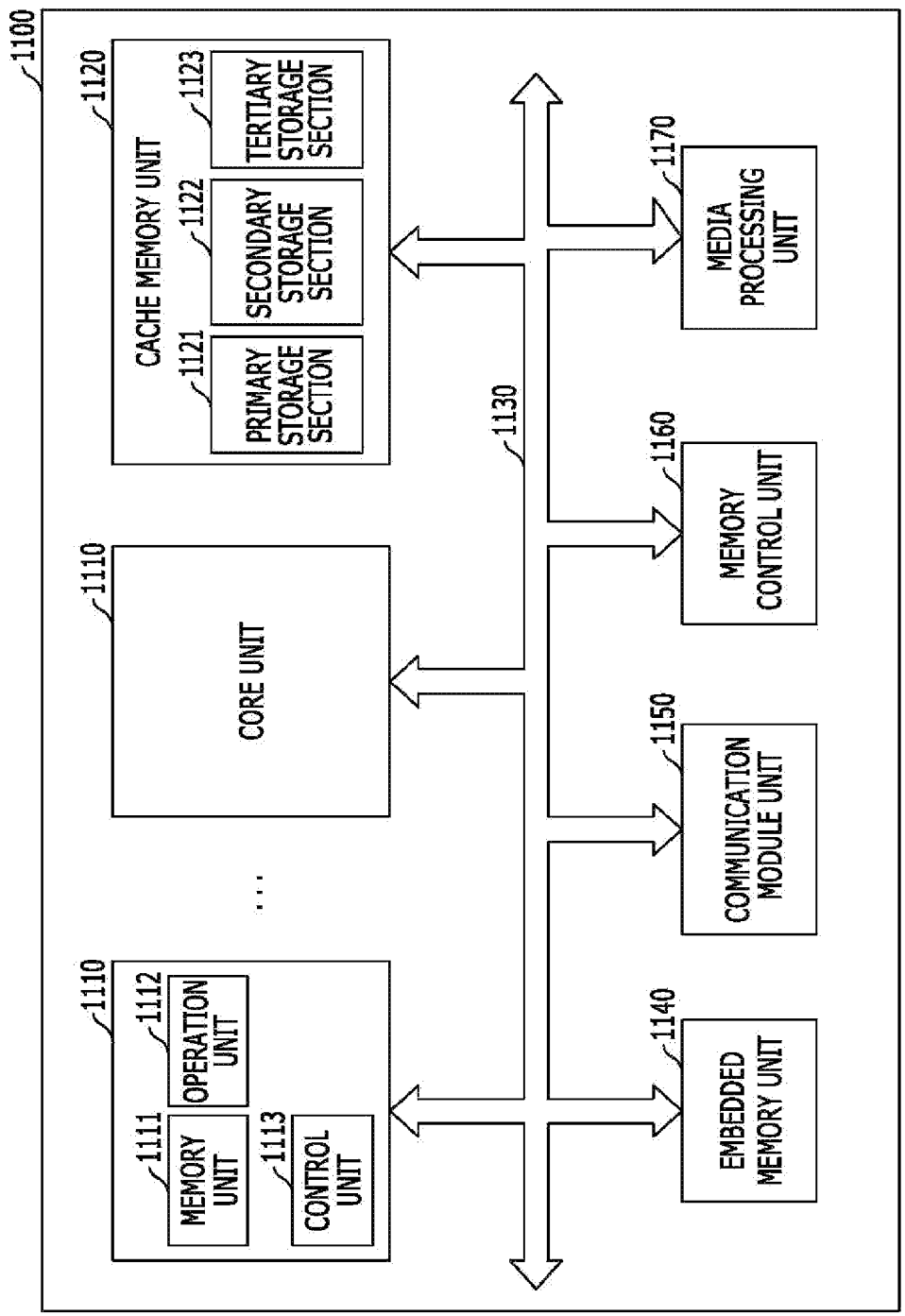
FIG. 8 is a configuration diagram of a processor in accordance with another embodiment.

FIG. 8 is a configuration diagram of a processor in accordance with an embodiment.

Referring to FIG. 8, a processor 1100 may improve performance and realize multi-functionality by including various functions in addition to controlling and tuning a series of processes of receiving data from various external devices, processing the data, and outputting processing results to external devices. The processor 1100 may include a core unit 1110, a cache memory unit 1120, and a bus interface 1130. The core unit 1110 is a part which performs arithmetic logic operations for data inputted from an external device, and may include a memory unit 1111, an operation unit 1112 and a control unit 1113. The processor 1100 may be various system-on-chips (SoCs) such as a multi-core processor, a graphic processing unit (GPU) and an application processor (AP).

The memory unit 1111 is a component which stores data in the processor 1100, as a processor register or a register. The memory unit 1111 may include a data register, an address register and a floating point register. In addition, the memory unit 1111 may include various registers. The memory unit 1111 may perform the function of temporarily storing (i) data for which operations are to be performed by the operation unit 1112, (ii) result data obtained by performing the operations and (iii) an address where data for performing of the operations are stored. The operation unit 1112 is a component which performs operations in the processor 1100. The operation unit 1112 performs arithmetical operations or logical operations in response to signals from the control unit 1113. The operation unit 1112 may also include at least one arithmetic logic unit (ALU). The control unit 1113 receives signals from the memory unit 1111, the operation unit 1112, and an external device of the processor 1100, performs extraction, decoding, controlling upon input and output of commands, and executes processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 when high storage capacity is desired. When appropriate, the cache memory unit 1120 may include an increased number of storage sections. That is to say, the number of storage sections which are included in the cache memory unit 1120 may be changed according to a chip design. The speeds at which the primary, secondary, and tertiary storage sections 1121, 1122 and 1123 store and discriminate data may be substantially the same or different. In the case where the speeds of the respective storage sections 1121, 1122 and 1123 are different, the speed of the primary storage section 1121 may be set to be the fastest. At least one storage section of the primary storage section 1121, the secondary storage section 1122, and the tertiary storage section 1123 of the cache memory unit 1120 may include one of the above-described semiconductor devices. The cache memory unit 1120 including the semiconductor device in accordance with an embodiment may include first lines extending in a first direction; second lines extending in a second direction crossing with the first direction; and first resistance variable elements defined between the first lines and the second lines and each including a first substance layer and a second substance layer, wherein the first substance layer extends in the first direction and the second substance layer extends in the second direction. Through this, a fabrication process of the cache memory unit 1120 may become easy, scaling of the cache memory unit 1230 may be possible and the reliability of the cache memory unit 1120 may be improved. As a consequence also, a fabrication process of the processor 1100 may become easy, scaling of the processor 1100 may be possible and the reliability of the processor 1100 may be improved.

Although it was shown in FIG. 8 that all the primary, secondary, and tertiary storage sections 1121, 1122 and 1123 are configured inside the cache memory unit 1120, the embodiments are not limited thereto. For example, it is to be noted that all the primary, secondary, and tertiary storage sections 1121, 1122 and 1123 of the cache memory unit 1120 may be configured outside the core unit 1110 and may compensate for a difference in data processing speed between the core unit 1110 and the external device. For another example, the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed.

The bus interface 1130 is a part which connects the core unit 1110 and the cache memory unit 1120 for effective transmission of data.

As shown in FIG. 8, the processor 1100 according to an embodiment may include a plurality of core units 1110, and the plurality of core units 1110 may share the same cache memory unit 1120. The plurality of core units 1110 and the cache memory unit 1120 may be connected through the bus interface 1130. The plurality of core units 1110 may be configured in substantially the same way as the above-described configuration of the core unit 1110. In the case where the processor 1100 includes the plurality of core units 1110, the primary storage section 1121 of the cache memory unit 1120 may be configured in each core unit 1110, and the secondary storage section 1122 and the tertiary storage section 1123 may be configured outside the plurality of core units 1110 in such a way as to be shared through the bus interface 1130.

In an embodiment, the processing speed of the primary storage section 1121 may be faster than the processing speeds of the secondary and tertiary storage section 1122 and 1123.

The processor 1100 may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device. In addition, the processor 1100 may include a plurality of modules. In this case, the plurality of modules which are added may exchange data with the core units 1110, the cache memory unit 1120, and other units, through the bus interface 1130.

The embedded memory unit 1140 may include not only a volatile memory but also a nonvolatile memory. The volatile memory may include a dynamic random access memory (DRAM), a mobile DRAM, a static random access memory (SRAM), and the like. The nonvolatile memory may include a read only memory (ROM), a NOR flash memory, a NAND flash memory, a phase change random access memory (PRAM), a resistive random access memory (RRAM), a spin transfer torque random access memory (STTRAM), a magneto-resistive random access memory (MRAM), and the like.

The communication module unit 1150 may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

The memory control unit 1160 is to administrate data transmitted between the processor 1100 and an external storage device operating according to a different communication standard. The memory control unit 1160 may include various memory controllers, for example, controllers for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processing unit 1170 processes the data processed in the processor 1100 or the data inputted from the external input device and output the processed data to the external interface device to be transmitted in the forms of image, voice and others, and may include a graphic processing unit (GPU), a digital signal processor (DSP), a high definition audio (HD audio), a high definition multimedia interface (HDMI) controller, and the like.

Figure 9:
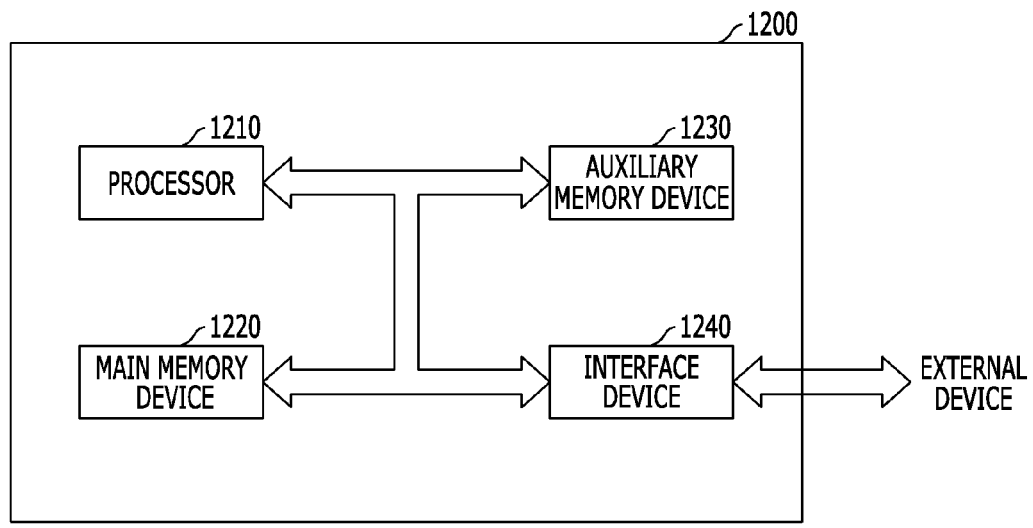
FIG. 9 is a configuration diagram of a system in accordance with another embodiment.

FIG. 9 is a configuration diagram of a system in accordance with an embodiment.

Referring to FIG. 9, a system 1200 as an apparatus for processing data may perform input, processing, output, communication, storage, etc. to conduct a series of manipulations on data. The system 1200 may include a processor 1210, a main memory device 1220, an auxiliary memory device 1230, and an interface device 1240. The system 1200 of the present embodiment may comprise one of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1210 controls decoding of inputted commands and processing such as operation, comparison, etc. for the data stored in the system 1200, and may comprise a microprocessor unit (MPU), a central processing unit (CPU), a single/multi-core processor, a graphic processing unit (GPU), an application processor (AP), a digital signal processor (DSP), and the like.

The main memory device 1220 is a memory which can call and execute programs or data from the auxiliary memory device 1230 when programs are executed and can conserve memorized contents even when power supply is cut off. The main memory device 1220 may include one of the above-described semiconductor devices. The main memory device 1220 including a semiconductor device as described herein may include first lines extending in a first direction; second lines extending in a second direction crossing with the first direction; and first resistance variable elements defined between the first lines and the second lines and each including a first substance layer and a second substance layer, wherein the first substance layer extends in the first direction and the second substance layer extends in the second direction. Through this, a fabrication process of the main memory device 1220 may become easy, scaling of the main memory device 1220 may be possible and the reliability of the main memory device 1220 may be improved. As a consequence also, a fabrication process of the system 1200 may become easy, scaling of the system 1220 may be possible and the reliability of the system 1200 may be improved. Also, the main memory device 1220 may further include a volatile memory such as a static random access memory (SRAM), a dynamic random access memory (DRAM), and the like in which all contents are erased when power supply is cut off. Unlike this, the main memory device 1220 may not include the semiconductor devices according to the embodiments, but may include a static random access memory (SRAM), a dynamic random access memory (DRAM), and the like, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one of the above-described semiconductor devices in accordance with the embodiments. The auxiliary memory device 1230 including the semiconductor device in accordance with the aforementioned embodiment may include first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction. Through this, a fabrication process of the auxiliary memory device 1230 may become easy, scaling of the auxiliary memory device 1230 may be possible and the reliability of the auxiliary memory device 1230 may be improved. As a consequence, a fabrication process of the system 1200 may become easy, scaling of the system 1200 may be possible and the reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1230 may not include the semiconductor devices according to the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), and a communication device. The communication device may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

Figure 10:
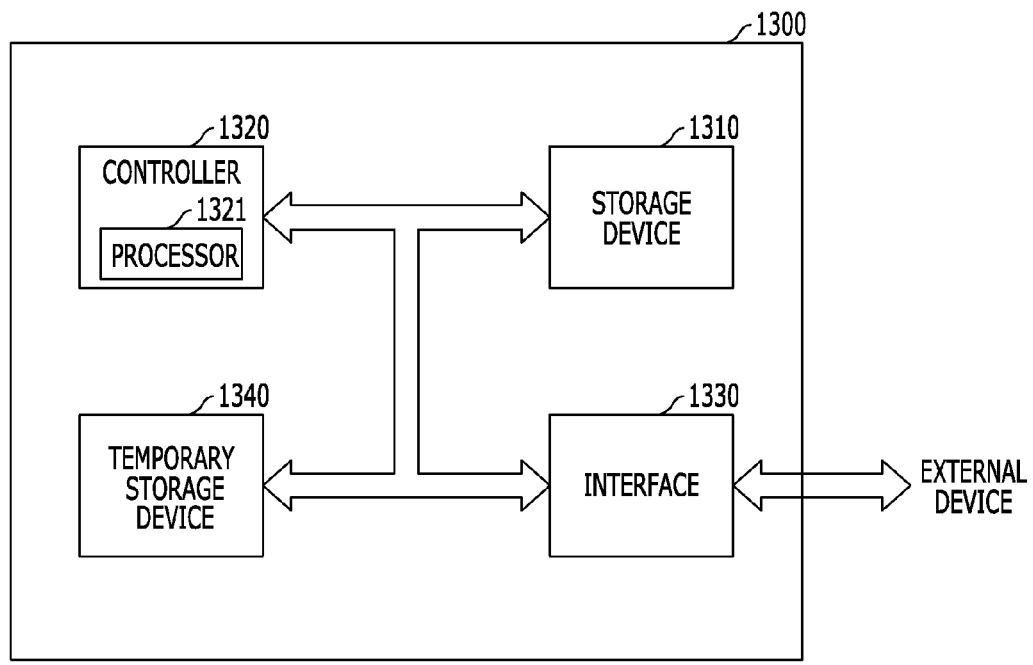
FIG. 10 is a configuration diagram of a data storage system in accordance with another embodiment.

FIG. 10 is a configuration diagram of a data storage system in accordance with an embodiment.

Referring to FIG. 10, a data storage system 1300 may include a storage device 1310 which has a nonvolatile characteristic as a component for storing data, a controller 1320 which controls the storage device 1310, and an interface 1330 for connection with an external device. The data storage system 1300 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The controller 1320 may control exchange of data between the storage device 1310 and the interface 1330. To this end, the controller 1320 may include a processor 1321 for performing an operation for and processing commands inputted through the interface 1330 from an outside of the data storage system 1300.

The interface 1330 is to perform exchange of commands and data between the data storage system 1300 and the external device. In the case where the data storage system 1300 is a card type, the interface 1330 may be an interface which is compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. In the case where the data storage system 1300 is a disk type, the interface 1330 may be an interface which is compatible with IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like.

The data storage system 1300 according to the present embodiment may further include a temporary storage device 1340 for efficiently transferring data between the interface 1330 and the storage device 1310 according to diversification and high performance of an interface with an external device, a controller and a system. The storage device 1310 and the temporary storage device 1340 for temporarily storing data may include one of the above-described semiconductor devices in accordance with the embodiments. The storage device 1310 or the temporary storage device 1340 including the semiconductor device in accordance with the aforementioned embodiment may include first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction. Through this, a fabrication process of the storage device 1310 or the temporary storage device 1340 may become easy, scaling the storage device 1310 of the temporary storage device 1340 may be possible and the reliability of the storage device 1310 or the temporary storage device 1340 may be improved. As a consequence, a fabrication process of the data storage system 1300 may become easy, scaling of the data storage system 1300 may be possible and the reliability of the data storage system 1300 may be improved.

Figure 11:
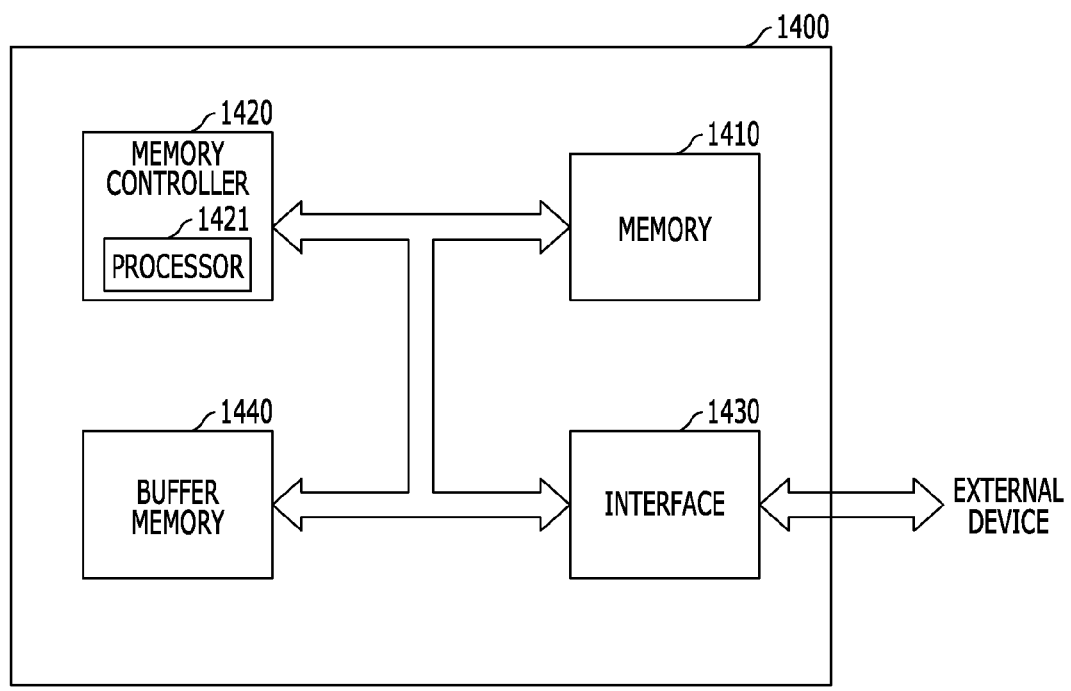
FIG. 11 is a configuration diagram of a memory system in accordance with another embodiment.

FIG. 11 is a configuration diagram of a memory system in accordance with an embodiment.

Referring to FIG. 11, a memory system 1400 may include a memory 1410 which has a nonvolatile characteristic as a component for storing data, a memory controller 1420 which controls the memory 1410, and an interface 1430 for connection with an external device. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1410 for storing data may include one of the above-described semiconductor devices in accordance with the embodiments. The memory 1410 including the semiconductor device in accordance with the aforementioned embodiment may include first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction. Through this, a fabrication process of the memory 1410 may become easy, scaling of the memory 1410 may be possible and the reliability of the memory 1410 may be improved. As a consequence, a fabrication process of the memory system 1400 may become easy, scaling of the memory system 1400 may be possible and the reliability of the memory system 1400 may be improved. Also, the memory 1410 according to the present embodiment may further include a ROM (read only memory), a NOR flash memory, a NAND flash memory, a phase change random access memory (PRAM), a resistive random access memory (RRAM), a magnetic random access memory (MRAM), and the like, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device.

The interface 1430 may be compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory system 1400 according to the present embodiment may further include a buffer memory 1440 for efficiently transferring data between the interface 1430 and the memory 1410 according to diversification and high performance of an interface with an external device, a memory controller and a memory system. The buffer memory 1440 for temporarily storing data may include one of the above-described semiconductor devices in accordance with the embodiments.

The buffer memory 1440 including the semiconductor device in accordance with the aforementioned embodiment may include first lines extending in a first direction; second lines extending in a second direction crossing with the first direction; and first resistance variable elements interposed between the first lines and the second lines and each including a first substance layer and a second substance layer, wherein the first substance layer extends in the first direction and the second substance layer extends in the second direction. Through this, a fabrication process of the buffer memory 1440 may become easy, scaling of the buffer memory 1440 may be possible and the reliability of the buffer memory 1440 may be improved. As a consequence, a fabrication process of the memory system 1400 may become easy, scaling of the memory system 1400 may be possible and the reliability of the memory system 1400 may be improved.

Moreover, the buffer memory 1440 according to the present embodiment may further include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic.

Unlike this, the buffer memory 1440 may not include the semiconductor devices according to the embodiments, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic. Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   first lines extending in a first direction;
   second lines extending in a second direction crossing with the first direction; and
   first resistance variable elements defined between the first lines and the second lines and each including a first substance layer and a second substance layer,
   wherein the first substance layer extends in the first direction and the second substance layer extends in the second direction, and
   wherein the first resistance variable elements are defined at crossing regions of the first substance layer and the second substance layer, the first substance layer and the second substance layer are in contact with one another at the crossing regions.

2. The semiconductor device according to claim 1, wherein the first substance layer comprises an oxygen-deficient metal oxide layer and the second substance layer comprises an oxygen-rich metal oxide layer, wherein the oxygen-deficient metal oxide layer is deficient in oxygen compared to the oxygen-rich metal oxide layer.

3. The semiconductor device according to claim 2, wherein the oxygen-rich metal oxide layer satisfies a stoichiometric ratio.

4. The semiconductor device according to claim 1, wherein the first substance layer has the same planar shape as the first lines, and wherein the second substance layer has the same planar shape as the second lines.

5. The semiconductor device according to claim 1, further comprising:
   third lines extending in the first direction; and
   second resistance variable elements defined between the second lines and the third lines, each second resistance variable element comprising a third substance layer and a fourth substance layer,
   wherein the third substance layer extends in the second direction and the fourth substance layer extends in the first direction.

6. The semiconductor device according to claim 5, wherein a first material is used to form the first substance layer and the third substance layer, and a second material is used to form the second substance layer and the fourth substance layer.

7. The semiconductor device according to claim 5, wherein a first material is used to form the first substance layer and the fourth substance layer, and a second material is used to form the second substance layer and the third substance layer.

8. The semiconductor device according to claim 1, further comprising:
   first spacers disposed on sidewalls of the first substance layer and extending in the first direction.

9. The semiconductor device according to claim 1, further comprising:
   second spacers disposed on sidewalls of the second substance layer and extending in the second direction.

10. The semiconductor device according to claim 1, wherein the second substance layer covers surfaces of the second lines which face the first lines, and wherein the second substance layer also covers side surfaces of the second lines.

11. A semiconductor device comprising:
    first lines extending in a first direction;
    second lines extending in a second direction crossing with the first direction; and
    first resistance variable elements defined between the first lines and the second lines and each including a first substance layer and a second substance layer,
    wherein the first substance layer extends in the first direction and the second substance layer extends in the second direction, and
    wherein the first substance layer has the same planar shape as the first lines, and wherein the second substance layer has the same planar shape as the second lines.

* * * * *